(12) United States Patent
Na et al.

(10) Patent No.: US 10,958,102 B2
(45) Date of Patent: *Mar. 23, 2021

(54) ELECTROMAGNETIC-INDUCTIVE POWER SUPPLY APPARATUS

(71) Applicant: AMOSENSE CO., LTD, Cheonan-si (KR)

(72) Inventors: Won-San Na, Seoul (KR); Jin-Pyo Park, Seoul (KR); Jung-Hyun Choi, Gwangju-si (KR)

(73) Assignee: AMOSENSE CO., LTD, Chungcheongnam-Do (KR)

( * ) Notice: Subject to any disclaimer, the term of this patent is extended or adjusted under 35 U.S.C. 154(b) by 95 days.

This patent is subject to a terminal disclaimer.

(21) Appl. No.: 16/340,335

(22) PCT Filed: Oct. 11, 2017

(86) PCT No.: PCT/KR2017/011199
§ 371 (c)(1),
(2) Date: Apr. 8, 2019

(87) PCT Pub. No.: WO2018/070779
PCT Pub. Date: Apr. 19, 2018

(65) Prior Publication Data
US 2020/0044483 A1 Feb. 6, 2020

(30) Foreign Application Priority Data

Oct. 11, 2016 (KR) .................. 10-2016-0131429

(51) Int. Cl.
*H01F 27/00* (2006.01)
*H02J 50/10* (2016.01)
(Continued)

(52) U.S. Cl.
CPC ............ *H02J 50/10* (2016.02); *G01R 19/165* (2013.01); *G05F 1/12* (2013.01)

(58) Field of Classification Search
CPC ........ H02J 50/10; H02J 50/005; H02J 50/402; H02J 50/001; H01F 27/24; H01F 27/30;
(Continued)

(56) References Cited

U.S. PATENT DOCUMENTS 9,673,694 B2* 6/2017 Koo .................. H02J 50/001
9,774,218 B2* 9/2017 Kai .................... H02J 50/12
(Continued)

FOREIGN PATENT DOCUMENTS

KR 2004-0081414 A 9/2004
KR 2010-0090009 A 8/2010
(Continued)

*Primary Examiner* — Ryan Jager
(74) *Attorney, Agent, or Firm* — CL Intellectual LLC

(57) ABSTRACT

Disclosed is an electromagnetic-inductive power supply apparatus, which switches so that a plurality of coils winding around a current transformer core is connected in series to a rectification unit based on the voltage induced in the current transformer, thereby producing the power within the set range even in a state where the voltage outside the reference is induced. The disclosed electromagnetic-inductive power supply apparatus senses the voltage induced in the current transformer and switches the plurality of unit coils is connected to the rectification unit based on the voltage sensed.

15 Claims, 6 Drawing Sheets

(51) Int. Cl.
*G01R 19/165* (2006.01)
*G05F 1/12* (2006.01)

(58) Field of Classification Search
CPC .... H01F 2027/408; H01F 29/02; H01F 38/32; G01R 19/165; G05F 1/12
USPC ......................................................... 307/104
See application file for complete search history.

(56) References Cited

U.S. PATENT DOCUMENTS

| | | | |
|---|---|---|---|
| 9,831,681 B2* | 11/2017 | Shimokawa | .......... B60L 53/126 |
| 2010/0097830 A1* | 4/2010 | Wang | ...................... H02J 50/12 |
| | | | 363/126 |
| 2019/0156998 A1* | 5/2019 | Park | ...................... H01F 27/402 |
| 2019/0280526 A1* | 9/2019 | Na | .......................... H02M 5/12 |

FOREIGN PATENT DOCUMENTS

| | | |
|---|---|---|
| KR | 10-1189298 B1 | 10/2012 |
| KR | 10-1342585 B1 | 12/2013 |
| KR | 2014-0093498 A | 7/2014 |
| WO | 2016/064725 A | 4/2016 |

\* cited by examiner

ELECTROMAGNETIC-INDUCTIVE POWER SUPPLY APPARATUS

CROSS-REFERENCE TO RELATED APPLICATIONS

This application is a National Stage of International patent application PCT/KR2017/011199, filed on Oct. 11, 2017, which claims priority to foreign Korean patent application No. KR 10-2016-0131429, filed on Oct. 11, 2016, the disclosures of which are incorporated by reference in their entirety.

FIELD OF THE INVENTION

The present disclosure relates to an electromagnetic-inductive power supply apparatus, and more particularly, to an electromagnetic-inductive power supply apparatus, which produces power by using the electromagnetic-inductive phenomenon between a line and a current transformer to supply power to a load.

Recently, various types of electromagnetic-inductive power supply apparatuses have been developed as the interest in a power supply method using the electromagnetic-inductive phenomenon increases.

The electromagnetic-inductive type power supply apparatus includes a current transformer installed at a power line in which a large-capacity of current flows, such as a transmission line or a distribution line. The electromagnetic-inductive type power supply apparatus converts the power acquired from the current transformer through the electromagnetic-inductive phenomenon into DC to supply it to a load.

Since a conventional electromagnetic-inductive type power supply apparatus (hereinafter, referred to as an electromagnetic-inductive power supply apparatus) is low in the amount of power that can be produced in a single current transformer, it is difficult to produce the power required when a low current flows through the line (i.e., power consumption).

To supplement this, an electromagnetic-inductive power supply apparatus using a plurality of current transformers has been developed. The conventional electromagnetic-inductive power supply apparatus converts the AC current produced in the plurality of current transformers into DC power and then supplies the sum thereof to the load.

For this purpose, the conventional electromagnetic-inductive power supply apparatus is configured to include a plurality of converters connected one to one with the plurality of current transformers.

At this time, there is a problem in that loss occurs in the conventional electromagnetic-inductive power supply apparatus in the process of converting power in the converter (i.e., converting AC current into DC power), thereby reducing the power acquisition efficiency.

In addition, there is a problem in that since the conventional electromagnetic-inductive power supply apparatus requires the converter to be installed for each current transformer, the number of mounting parts increases, thereby increasing the installation cost and the maintenance cost.

In addition, there is a problem in that it is not possible for the conventional electromagnetic-inductive power supply apparatus to produce the required power (power source) by the loss occurring in the process of inducing the current, which is equal to or lower than the reference, induced in the current transformer when a low current flows through the line and converting DC power.

In addition, there is a problem in that in the conventional electromagnetic-inductive power supply apparatus, the parts are damaged by an inrush voltage having a high voltage generated at the initial operation.

SUMMARY OF THE INVENTION

The present disclosure is intended to solve the above conventional problems, and an object of the present disclosure is to provide an electromagnetic-inductive power supply apparatus, which winds a plurality of coils having different number of windings from each other around a current transformer core and switches so that at least one coil thereof is connected in series to a rectification unit based on the voltage induced in the current transformer, thereby producing the power within the set range even in a state where the voltage outside the reference is induced.

In addition, another object of the present disclosure is to provide an electromagnetic-inductive power supply apparatus, which switches so that the unit coil having the smallest number of windings is connected in series to the rectification unit during the set time at the initial operation, thereby preventing the parts from being damaged due to an excessive inrush voltage at the initial operation.

For achieving the objects, an electromagnetic-inductive power supply apparatus according to an embodiment of the present disclosure includes a current transformer installed at a power line and having a plurality of unit coils for inducing a voltage, a sensing unit for sensing the voltage induced in the current transformer, a rectification unit for rectifying the voltage induced in the current transformer, and a switching unit for switching so that at least one among the plurality of unit coils is connected to the rectification unit based on the voltage sensed in the sensing unit.

The switching unit can switch so that the unit coil having the smallest number of windings among the plurality of unit coils is connected to the rectification unit during the set time at the initial operation, and can switch so that at least one among the plurality of unit coils is connected to the rectification unit based on the voltage sensed in the sensing unit after the set time has elapsed since the initial operation. At this time, the switching unit can switch so that two or more unit coils among the plurality of unit coils are connected to the rectification unit when the voltage sensed in the sensing unit is lower than the minimum reference voltage, and can switch so that the unit coil having the smallest number of windings among the plurality of unit coils is connected to the rectification unit when the voltage sensed in the sensing unit exceeds the maximum reference voltage.

According to the present disclosure, it is possible for the electromagnetic-inductive power supply apparatus to switch so that at least one among the plurality of unit coils having different number of windings from each other is connected in series to the rectification unit according to the voltage induced in the power line, thereby regulating the power induction ratio according to a change in the current of the power line to provide a constant power to the load.

In addition, it is possible for the electromagnetic-inductive power supply apparatus to switch so that the at least one among the plurality of unit coils having different number of windings from each other is connected in series to the rectification unit according to the voltage induced in the power line, thereby producing the power within the range required in the load even in a state where the current outside the reference (i.e., the current lower than the reference, the current exceeding the reference) is induced.

In addition, it is possible for the electromagnetic-inductive power supply apparatus to switch so that the plurality of unit coils are connected in series to the rectification unit when the voltage induced in the power line is lower than the reference, thereby providing the power within the range required in the load even in a state where the voltage induced in the power line is low.

In addition, it is possible for the electromagnetic-inductive power supply apparatus to switch so that the unit coil having the smallest number of windings among the plurality of unit coils is connected in series to the rectification unit when the voltage induced in the power line exceeds the reference, thereby supplying the power within the range required in the load even in a state where the voltage induced in the power line is excessive.

In addition, it is possible for the electromagnetic-inductive power supply apparatus to induce a constant power even when the current of the power line changes to reduce the complexity or the capacity of the rectification unit, thereby easily implementing an optimum system, and reducing the manufacturing cost.

In addition, it is possible for the electromagnetic-inductive power supply apparatus to switch with the unit coil having the minimum number of windings during the set time at the initial operation to reduce the inrush voltage of the high voltage occurring at the initial operation, thereby preventing the parts from being damaged by the inrush voltage.

In addition, it is possible for the electromagnetic-inductive power supply apparatus to stabilize the input voltage, thereby reducing the voltage loss and increasing the power acquisition efficiency.

In addition, it is possible for the electromagnetic-inductive power supply apparatus to control the switching unit according to the voltage induced in the power line to connect at least one among the plurality of unit coils in series, thereby enabling the efficient energy control in the normal operation section (i.e., the section in Which the induced voltage is equal to or higher than the minimum reference voltage and is equal to or lower than the maximum reference voltage).

DETAILED DESCRIPTION

Figure 1:
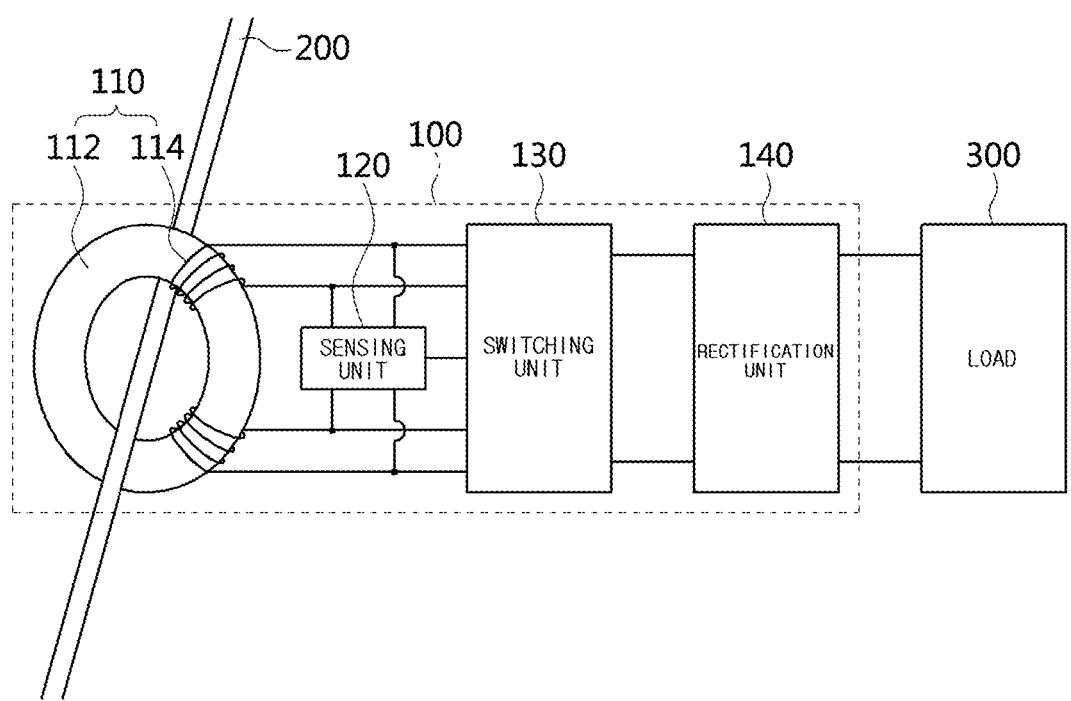
FIG. 1 is a diagram for explaining an electromagnetic-inductive power supply apparatus according to an embodiment of the present disclosure.

Hereinafter, the most preferred embodiment of the present disclosure will be described with reference to the accompanying drawings so that those skilled in the art to which the present disclosure pertains can easily practice the technical spirit of the present disclosure. First, in adding reference numerals to the components in each drawing, it is to be noted that the same components are denoted by the same reference numerals even though they are illustrated in different drawings. In addition, in the following description of the present disclosure, a detailed description of known configurations or functions will be omitted when it is determined to obscure the subject matter of the present disclosure.

Referring to FIG. 1, an electromagnetic-inductive power supply apparatus 100 is configured to include a current transformer 110, a sensing unit 120, a switching unit 130, and a rectification unit 140.

The current transformer 110 is installed at a power line 200 through which a large-capacity of current flows to induce a voltage (or current, power) from the large-capacity of current flowing through the power line 200. The current transformer 110 is formed in a structure that can be detached from and attached to the power line 200, such as a clamp type. For example, the current transformer 110 divides a core 112 inside the current transformer 110 into two in order to be easily detached from and attached to the power line 200, thereby constituting an upper core and a lower core.

A plurality of unit coils 114 are wound around the core 112. At this time, at least two unit coils among the plurality of unit coils 114 are wound to have different number of windings from each other.

For example, the current transformer 110 is provided with the core 112, and a first unit coil 114a and a second unit coil 114b, which are configured to wind around the core 112, and to have different number of windings from each other. Herein, in order to easily explain the electromagnetic-inductive power supply apparatus 100, although it has been described that the current transformer 110 includes the first unit coil 114a and the second unit coil 114b, it is not limited thereto and the current transformer 110 can also be configured to include three or more unit coils 114.

The core 112 is configured to include the upper core and the lower core. At this time, at least one of the upper core and the lower core is formed with the first unit coil 114a and the second unit coil 114b.

The first unit coil 114a is composed of a coil that winds around the core 112 in plural times. At this time, the surface of the first unit coil 114a can be coated with an insulating material.

The second unit coil 114b is composed of a coil that winds in plural times. The second unit coil 114b can be wound at the position different from the first unit coil 114a, or can be wound at the same position to be overlapped. At this time, the surface of the second unit coil 114b can be coated with an insulating material.

Meanwhile, the first unit coil 114a and the second unit coil 114b are formed to have a winding ratio of about 3:1. For example, when the first unit coil 114a is composed of a coil that winds around the core 112 150 times, the second unit coil 114b is composed of a coil that winds around the core 112 50 times.

At this time, both ends of the first unit coil 114a and the second unit coil 114b are connected to the switching unit 130.

The sensing unit 120 senses the voltage induced in the current transformer 110. At this time, the sensing unit 120 is connected in parallel with the rectification unit 140 to sense the voltage induced in the current transformer 110. The sensing unit 120 transmits the sensed voltage to the switching unit 130. Herein, the sensing unit 120 can also generate a switching signal based on the sensed voltage to transmit it to the switching unit 130.

Meanwhile, referring to FIG. 1, it can be understood that the sensing unit 120 is disposed between the rectification unit 140 and a load 300 to sense a constant voltage (i.e., a voltage supplied to the load).

However, the rectification unit 140 illustrated in FIG. 1 is a configuration of converting the voltage induced in the current transformer 110 into a DC voltage, and in the actual configuration, a DC-DC converter (not illustrated), which converts the DC voltage converted in the rectification unit 140 into the voltage required in the load, is disposed between the sensing unit 120 and the load 300.

Therefore, the voltage value sensed in the sensing unit 120 means the value of the DC voltage converted in the rectification unit 140 from the AC voltage induced in the current transformer 110.

On the other hand, although it has been illustrated in FIG. 1 that the sensing unit 120 is disposed between the rectification unit 140 and the load 300 to be connected in parallel with the rectification unit 140, it is not limited thereto and the sensing unit 120 is also disposed between the switching unit 130 and the rectification unit 140 to sense the value of the AC voltage (i.e., the voltage induced in the current transformer 110) applied through the switching unit.

The switching unit 130 switches so that at least one among the plurality of unit coils 114 is connected in series to the rectification unit 140 based on whether the electromagnetic-inductive power supply apparatus 100 is at the initial operation and the voltage sensed in the sensing unit 120.

The switching unit 130 switches so that the unit coil 114 having the smallest number of windings among the plurality of unit coils 114 is connected in series to the rectification unit 140 during the set time (e.g., about 1 minute) at the initial operation of the electromagnetic-inductive power supply apparatus 100.

That is, as the voltage that is equal to or higher than the maximum reference voltage is induced in the current transformer 110 at the initial operation of the electromagnetic-inductive power supply apparatus 100, the elements constituting the electromagnetic-inductive power supply apparatus 100 or constituting the load 300 can be damaged.

Therefore, the switching unit 130 switches so that the unit coil 114 having the smallest number of windings among the plurality of unit coils 114 is connected in series to the rectification unit 140 during the set time at the initial operation, such that the voltage that is equal to or lower than the maximum reference voltage is applied to the rectification unit 140. At this time, when the voltage sensed in the sensing unit 120 is not present or the power of the electromagnetic-inductive power supply apparatus 100 is turned off, the switching unit 130 can also set, as a default, to switch so that the unit coil 114 having the smallest number of windings is connected in series to the rectification unit 140.

Therefore, the switching unit 130 maintains the voltage applied to the rectification unit 140 at the voltage, which is equal to or lower than the maximum reference voltage, thereby preventing the elements constituting the electromagnetic-inductive power supply apparatus 100 and the load 300 from being damaged.

The switching unit 130 switches so that at least one among the plurality of unit coils 114 is connected in series to the rectification unit 140 based on the voltage sensed in the sensing unit 120 after the set time has elapsed since the initial operation of the electromagnetic-inductive power supply apparatus 100.

At this time, the switching unit 130 switches so that the plurality of unit coils 114 are connected in series to the rectification unit 140 when the voltage sensed in the sensing unit 120 is lower than the minimum reference voltage, thereby applying all voltages induced in the current transformer 110 to the rectification unit 140. Herein, the switching unit 130 can also switch so that some unit coils 114 (i.e., two or more) among the plurality of unit coils 114 are connected in series to the rectification unit 140, thereby applying the voltage that is equal to or higher than the minimum reference voltage to the rectification unit 140.

The switching unit 130 switches so that the unit coil 114 having the largest number of windings among the plurality of unit coils 114 is connected in series to the rectification unit 140 when the voltage sensed in the sensing unit 120 is equal to or higher than the minimum reference voltage and is equal to or lower than the maximum reference voltage, thereby applying the voltage induced in the unit coil 114 of the largest number of windings to the rectification unit 140.

The switching unit 130 switches so that the unit coil 114 having the smallest number of windings among the plurality of unit coils 114 is connected in series to the rectification unit 140 when the voltage sensed in the sensing unit 120 exceeds the maximum reference voltage, thereby applying the voltage induced in the unit coil of the smallest number of windings to the rectification unit 140.

Figure 2:
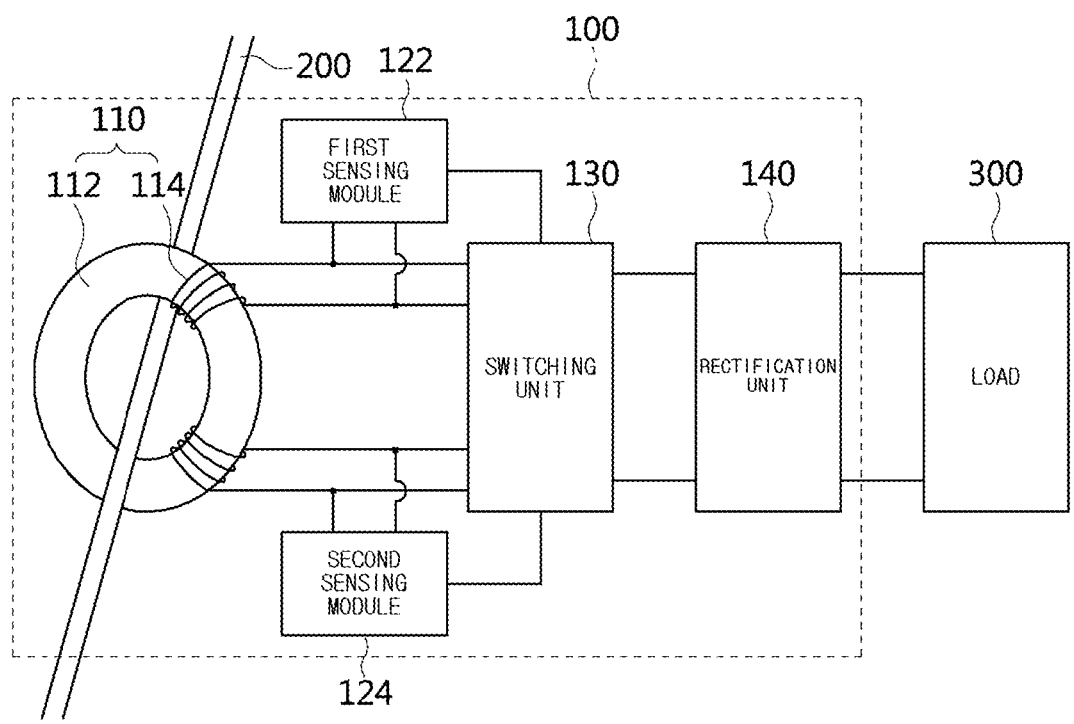
FIG. 2 is a diagram for explaining a sensing unit of FIG. 1.

As illustrated in FIG. 2, the current transformer 110 is composed of the first unit coil 114a and the second unit coil 114b that are spaced apart from each other and are wound around the core 112, and for example, when the first unit coil 114a has the number of windings higher than that of the second unit coil 114b, the switching unit 130 is configured to include a plurality of input terminals 132a to 132d connected to the first unit coil 114a and a second unit coil 114b, a pair of output terminals 134a, 1346 connected to the rectification unit 140, and a plurality of divert switches 136a to 136c.

That is, the switching unit 130 can include a first input terminal 132a connected to one end (a first end portion) of the first unit coil 114a, a second input terminal 132b connected to the other end (a second end portion) of the first unit coil 114a, a third input terminal 132c connected to one end (a first end portion) of the second unit coil 114b, and a fourth input terminal 132d connected to the other end (a second end portion) of the second unit coil 114b.

Herein, one end of the first unit coil 114a corresponds to the first end portion of the first unit coil recited in claims, and the other end of the first unit coil 114a corresponds to the second end portion of the first unit coil recited in claims. One end of the second unit coil 114b corresponds to the first end portion of the second unit coil recited in claims, and the other end of the second unit coil 114b corresponds to the second end portion of the second unit coil recited in claims.

The switching unit 130 can include a first output terminal 134a and a second output terminal 134b connected to two connection lines, respectively, connected to the rectification unit 140.

The switching unit 130 can include a first divert switch 136a for switching the first output terminal 134a to the first input terminal 132a or the third input terminal 132c, a second divert switch 136b for switching the second output terminal 134b to the second input terminal 132b or the fourth input terminal 132d, and a third divert switch 136c for switching the connection of the second input terminal 132b and the third input terminal 132c.

The switching unit 130 switches the connection of the input terminal and the output terminal based on the voltage induced in the current transformer 110 or whether the electromagnetic-inductive power supply apparatus 100 is at the initial operation to connect at least one of the first unit coil 114a and the second unit coil 114b of the current transformer 110 to the rectification unit 140 in series.

Since the voltage that is lower than the voltage required in the load 300 is applied when the voltage induced in the current transformer 110 is lower than the minimum reference voltage, the voltages induced in the first unit coil 114a and the second unit coil 114b should be all applied to the rectification unit 140.

Figure 3:
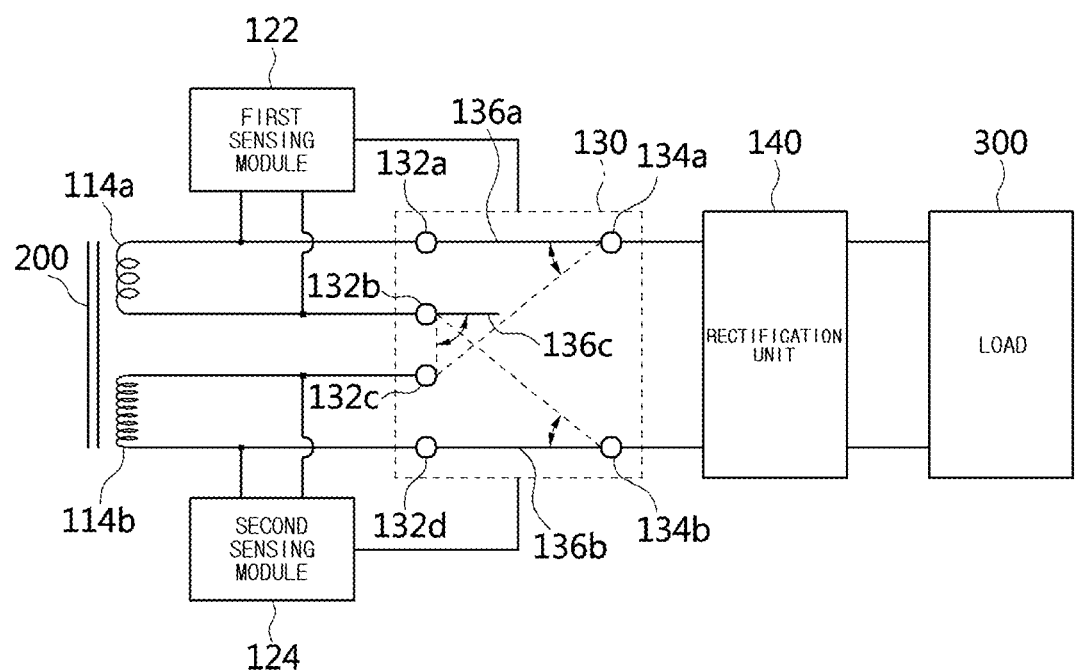
FIGS. 3 to 7 are diagrams for explaining a switching unit of FIG. 1.

Therefore, as illustrated in FIG. 3, the switching unit 130 switches the third divert switch 136c to connect the first unit coil 114a and the second unit coil 114b in series, switches so that the first divert switch 136a is connected to the first input terminal 132a and the first output terminal 134a, and switches so that the second divert switch 136b is connected to the fourth input terminal 132d and the second output terminal 134b, such that the first unit coil 114a and the second unit coil 114b are connected in series to the rectification unit 140.

Therefore, the voltage induced in the coil configured by connecting the first unit coil 114a and the second unit coil 114b in series is applied to the rectification unit 140.

Meanwhile, when the voltage induced in the current transformer 110 is equal to or higher than the minimum reference voltage and is equal to or lower than the maximum reference voltage, the voltage within the voltage range required in the load 300 is applied to the rectification unit 140.

Figure 4:
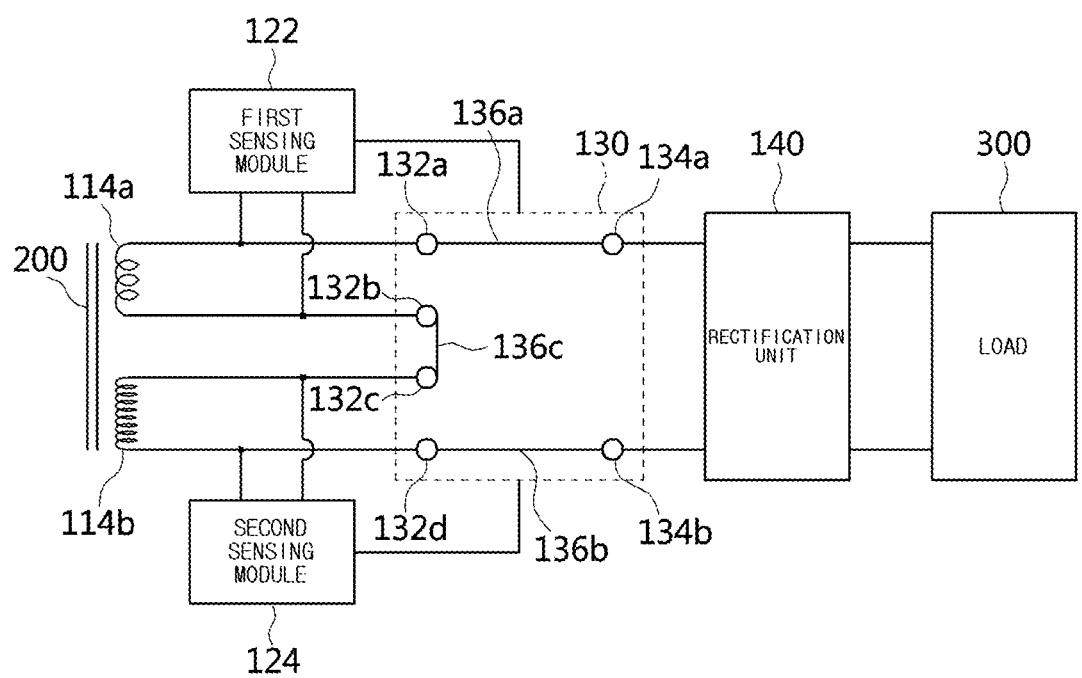

Therefore, as illustrated in FIG. 4, the switching unit 130 switches so that the first divert switch 136a is connected to the first input terminal 132a and the first output terminal 134a, and switches so that the second divert switch 136b is connected to the second input terminal 132b and the second output terminal 134b, thereby applying the voltage induced in the first unit coil 114a having the relatively large number of windings to the rectification unit 140.

On the other hand, when the voltage induced in the current transformer 110 exceeds the maximum reference voltage, the element constituting the rectification unit 140 can be damaged.

Figure 5:
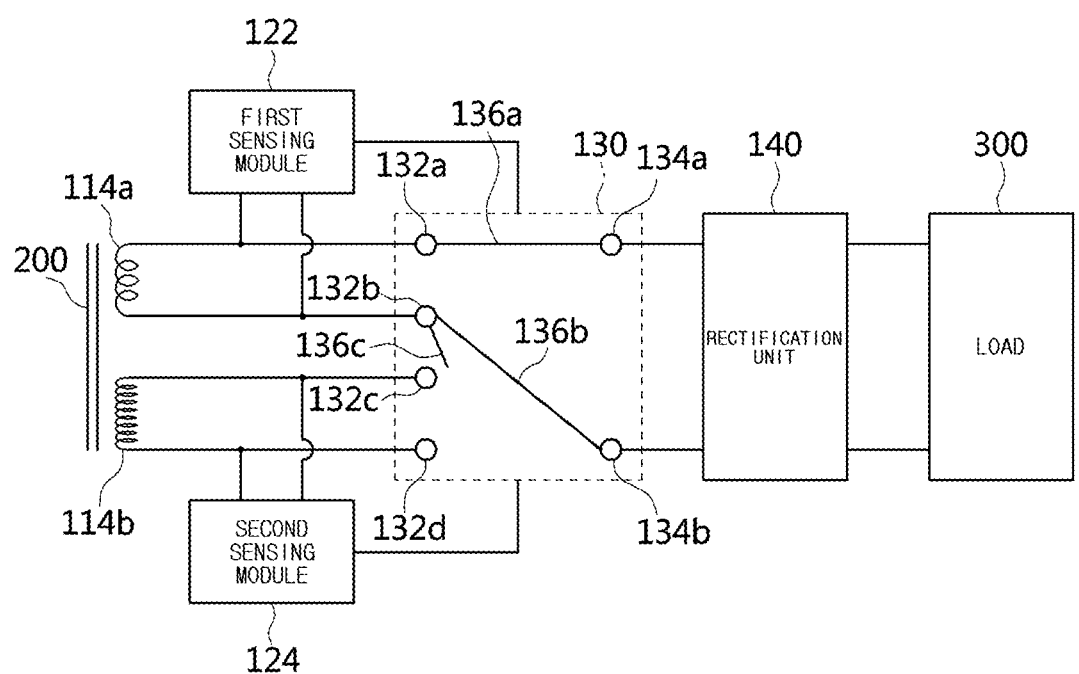

Therefore, as illustrated in FIG. 5, the switching unit 130 switches so that the first divert switch 136a is connected to the third input terminal 132c and the first output terminal 134a, and switches so that the second divert switch 136b is connected to the fourth input terminal 132d and the second output terminal 134b, thereby applying the voltage induced in the second unit coil 114b having the relatively small number of windings to the rectification unit 140.

Figure 6:
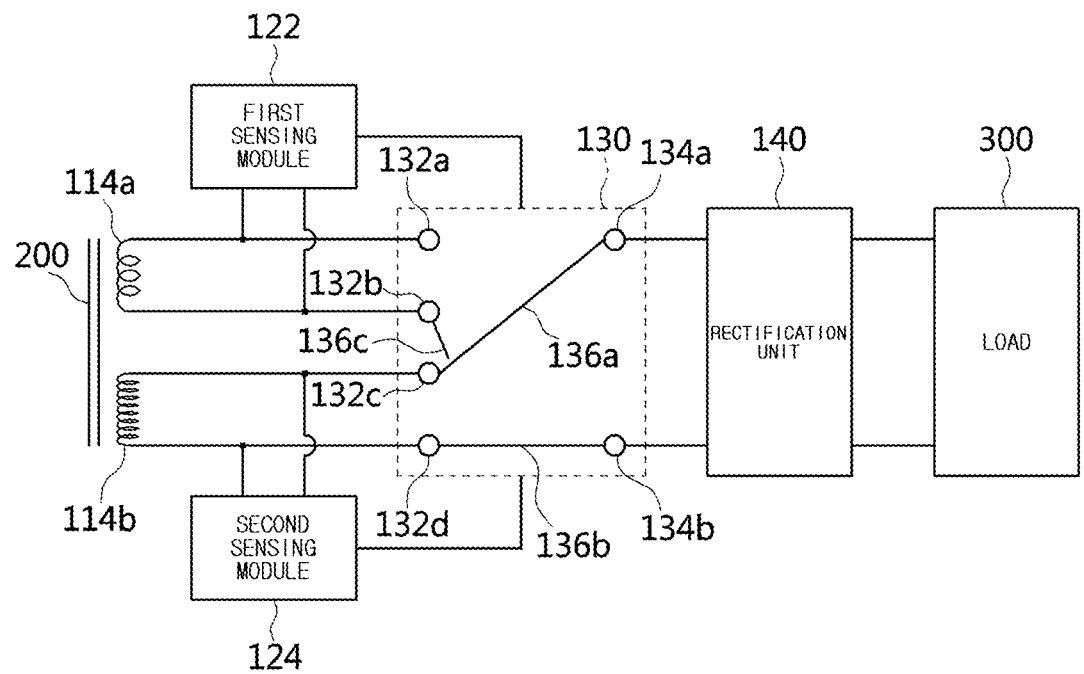
Figure 7:
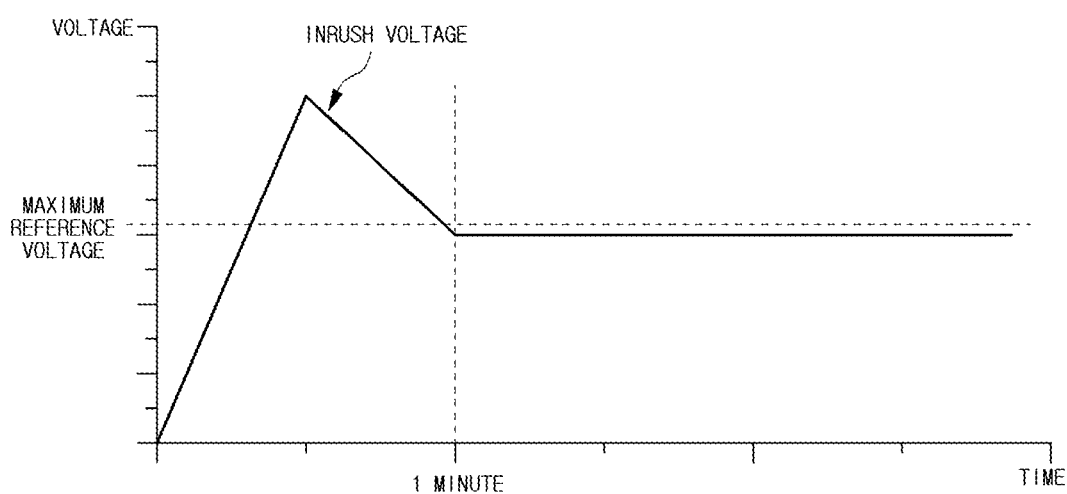

Meanwhile, referring to FIGS. 6 and 7, when the inrush voltage exceeding the maximum reference voltage is applied at the initial operation of the electromagnetic-inductive power supply apparatus 100, the element constituting the electromagnetic-inductive power supply apparatus 100 or the load 300 can be damaged.

Therefore, the switching unit 130 switches so that the first divert switch 136a is connected to the third input terminal 132c and the first output terminal 134a, and switches so that the second divert switch 136b is connected to the fourth input terminal 132d and the second output terminal 134b during the set time at the initial operation of the electromagnetic-inductive power supply apparatus 100, thereby applying the voltage induced in the second unit coil 114b having the relatively small number of windings to the rectification unit 140.

Therefore, the switching unit 130 can apply the voltage within the setting range to the rectification unit 140 regardless of the voltage induced in the current transformer 110, thereby preventing the element from being damaged.

The rectification unit 140 rectifies the voltage applied from the switching unit 130 through the connection lines to convert it into DC to supply it to the load 300. The rectification unit 140 can be composed of a full-wave rectification circuit or a half-wave rectification circuit composed of a plurality of diodes. The rectification unit 140 converts the voltage induced in at least one of the first unit coil 114a and the second unit coil 114b into DC according to the switching operation of the switching unit 130 to supply it to the load 300.

As described above, it is possible for the electromagnetic-inductive power supply apparatus to switch so that at least one among the plurality of unit coils having different number of windings from each other is connected in series to the rectification unit according to the voltage induced in the power line, thereby regulating the power induction ratio according to a change in the current of the power line to provide a constant power to the load.

In addition, it is possible for the electromagnetic-inductive power supply apparatus to switch so that the at least one among the plurality of unit coils having different number of windings from each other is connected in series to the rectification unit according to the voltage induced in the power line, thereby producing the power within the range required in the load even in a state where the current outside the reference (i.e., the current lower than the reference, the current exceeding the reference) is induced.

In addition, it is possible for the electromagnetic-inductive power supply apparatus to switch so that the plurality of unit coils are connected in series to the rectification unit when the voltage induced in the power line is lower than the reference, thereby providing the power within the range required in the load even in a state where the voltage induced in the power line is low.

In addition, it is possible for the electromagnetic-inductive power supply apparatus to switch so that the unit coil having the smallest number of windings among the plurality of unit coils is connected in series to the rectification unit when the voltage induced in the power line exceeds the reference, thereby supplying the power within the range required in the load even in a state where the voltage induced in the power line is excessive.

In addition, it is possible for the electromagnetic-inductive power supply apparatus to induce a constant power even when the current of the power line changes to reduce the complexity or the capacity of the rectification unit, thereby easily implementing an optimum system, and reducing the manufacturing cost.

In addition, it is possible for the electromagnetic-inductive power supply apparatus to switch with the unit coil having the minimum number of windings during the set time at the initial operation to reduce the inrush voltage of the high voltage occurring at the initial operation, thereby preventing the parts from being damaged by the inrush voltage.

In addition, it is possible for the electromagnetic-inductive power supply apparatus to stabilize the input voltage, thereby reducing the voltage loss and increasing the power acquisition efficiency.

In addition, it is possible for the electromagnetic-inductive power supply apparatus to control the switching unit according to the voltage induced in the power line to connect at least one among the plurality of unit coils in series, thereby enabling the efficient energy control in the normal operation section (i.e., the section in which the induced voltage is equal to or higher than the minimum reference voltage and is equal to or lower than the maximum reference voltage).

As described above, although preferred embodiments of the present disclosure have been described, it is to be understood that they can be modified into various forms, and various modifications and changes thereof can be embodied by those skilled in the art without departing from the claims of the present disclosure.

The invention claimed is:

1. An electromagnetic-inductive power supply apparatus, comprising:
   a current transformer installed at a power line and having a plurality of unit coils for inducing a voltage;
   a sensing unit for sensing a voltage induced in the current transformer;
   a rectification unit for rectifying the voltage induced in the current transformer; and
   a switching unit for switching so that at least one among the plurality of unit coils is connected to the rectification unit based on the voltage sensed in the sensing unit,
   wherein the switching unit switches so that a unit coil having the smallest number of windings among the plurality of unit coils is connected to the rectification unit during a set time at an initial operation.

2. The electromagnetic-inductive power supply apparatus of claim 1, wherein the plurality of unit coils have different number of windings from each other.

3. The electromagnetic-inductive power supply apparatus of claim 1, wherein the switching unit switches so that at least one among the plurality of unit coils is connected to the rectification unit based on the voltage sensed in the sensing unit after the set time has elapsed since the initial operation.

4. The electromagnetic-inductive power supply apparatus of claim 1, wherein the switching unit switches so that two or more unit coils among the plurality of unit coils are connected to the rectification unit when the voltage sensed in the sensing unit is lower than the minimum reference voltage.

5. The electromagnetic-inductive power supply apparatus of claim 1, wherein the switching unit switches so that the unit coil having the smallest number of windings among the plurality of unit coils is connected to the rectification unit when the voltage sensed in the sensing unit exceeds the maximum reference voltage.

6. The electromagnetic-inductive power supply apparatus of claim 1, wherein the current transformer comprises
   a core;
   a first unit coil wound around the core; and
   a second unit coil wound around the core, and having the number of windings smaller than that of the first unit coil.

7. The electromagnetic-inductive power supply apparatus of claim 6, wherein the switching unit switches so that the first unit coil and the second unit coil are connected in series to the rectification unit when the voltage sensed in the sensing unit is lower than the minimum reference voltage.

8. The electromagnetic-inductive power supply apparatus of claim 6, wherein the switching unit switches so that the first unit coil is connected in series to the rectification unit when the voltage sensed in the sensing unit is equal to or higher than the minimum reference voltage and is equal to or lower than the maximum reference voltage.

9. The electromagnetic-inductive power supply apparatus of claim 6, wherein the switching unit switches so that the second unit coil is connected in series to the rectification unit when the voltage sensed in the sensing unit exceeds the maximum reference voltage.

10. The electromagnetic-inductive power supply apparatus of claim 6, wherein the switching unit switches so that the second unit coil is connected in series to the rectification unit during the set time at the initial operation.

11. The electromagnetic-inductive power supply apparatus of claim 6, wherein the switching unit comprises
    a first input terminal connected to a first end portion of the first unit coil;
    a second input terminal connected to a second end portion of the first unit coil;
    a third input terminal connected to a first end portion of the second unit coil;
    a fourth input terminal connected to a second end portion of the second unit coil;
    a first output terminal connected to a first end portion of the rectification unit; and
    a second output terminal connected to a second end portion of the rectification unit.

12. The electromagnetic-inductive power supply apparatus of claim 11, wherein the switching unit switches the first input terminal to the first output terminal, switches the second input terminal to the third input terminal, and switches the fourth input terminal to the second output terminal when the voltage sensed in the sensing unit is lower than the minimum reference voltage.

13. The electromagnetic-inductive power supply apparatus of claim 11, wherein the switching unit switches the first input terminal to the first output terminal, and switches the second input terminal to the second output terminal when the voltage sensed in the sensing unit is equal to or higher than the minimum reference voltage and is equal to or lower than the maximum reference voltage.

14. The electromagnetic-inductive power supply apparatus of claim 11, wherein the switching unit switches the third input terminal to the first output terminal, and switches the fourth input terminal to the second output terminal when the voltage sensed in the sensing unit exceeds the maximum reference voltage.

15. The electromagnetic-inductive power supply apparatus of claim 11, wherein the switching unit switches the third input terminal to the first output terminal, and switches the fourth input terminal to the second output terminal during the set time at the initial operation.

* * * * *